United States Patent
Kittl et al.

(10) Patent No.: US 9,768,062 B1
(45) Date of Patent: Sep. 19, 2017

(54) METHOD FOR FORMING LOW PARASITIC CAPACITANCE SOURCE AND DRAIN CONTACTS

(71) Applicant: Samsung Electronics Co., Ltd., Suwon-si, Gyeonggi-do (KR)

(72) Inventors: Jorge A. Kittl, Austin, TX (US); David Seo, Seoul (KR); Kota Oikawa, Seoul (KR); Kim Changhwa, Hwaseong (KR); Rwik Sengupta, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/276,748

(22) Filed: Sep. 26, 2016

Related U.S. Application Data

(60) Provisional application No. 62/351,251, filed on Jun. 16, 2016.

(51) Int. Cl.
  *H01L 21/44* (2006.01)
  *H01L 21/768* (2006.01)

(52) U.S. Cl.
  CPC .. *H01L 21/76879* (2013.01); *H01L 21/76846* (2013.01)

(58) Field of Classification Search
  None
  See application file for complete search history.

(56) References Cited

U.S. PATENT DOCUMENTS

| | | |
|---|---|---|
| 6,010,931 A | 1/2000 | Sun et al. |
| 9,362,403 B2 | 6/2016 | Xie et al. |
| 2014/0312427 A1 | 10/2014 | Maeda et al. |
| 2015/0235897 A1 | 8/2015 | Fu et al. |
| 2016/0104787 A1 | 4/2016 | Kittl et al. |

*Primary Examiner* — Reema Patel
(74) *Attorney, Agent, or Firm* — Lewis Roca Rothgerber Christie LLP

(57) ABSTRACT

A method for forming a low parasitic capacitance contact to a source-drain structure of a fin field effect transistor device. In some embodiments the method includes etching a long trench down to the source-drain structure, the trench being sufficiently long to extend across all the of source-drain regions of the device. A conductive layer is formed on the source-drain structure, and the trench is filled with a first fill material. A second, narrower trench is opened along a portion of the length of the first trench, and filled with a second fill material. The first fill material may be conductive, and may form the contact. If the first fill material is not conductive, a third trench may be opened, in the portion of the first trench not filled with the second fill material, and filled with a conductive material, to form the contact.

20 Claims, 11 Drawing Sheets

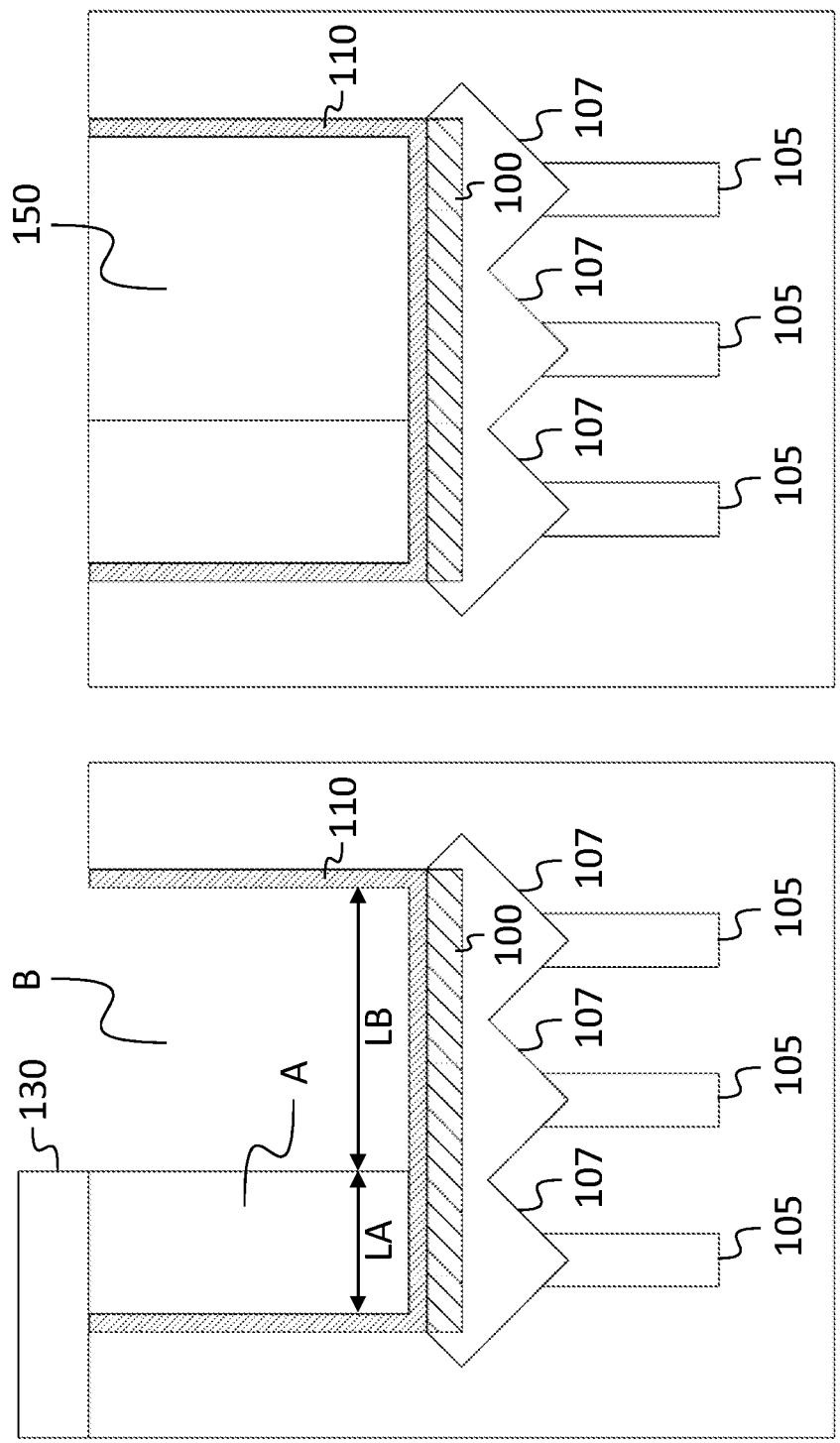

METHOD FOR FORMING LOW PARASITIC CAPACITANCE SOURCE AND DRAIN CONTACTS

CROSS-REFERENCE TO RELATED APPLICATION(S)

The present application claims priority to and the benefit of U.S. Provisional Application No. 62/351,251, filed Jun. 16, 2016, entitled "METHOD FOR LOW PARASITIC CAPACITANCE SOURCE AND DRAIN CONTACTS", the entire content of which is incorporated herein by reference.

The present application is related to U.S. patent application Ser. No. 14/878,230, the entire content of which is incorporated herein by reference.

FIELD

One or more aspects of embodiments according to the present invention relate to contacts in field effect transistors, and more particularly to a method for forming low parasitic capacitance source and drain contacts.

BACKGROUND

A low-capacitance contact to a source-drain contact in a multiple fin field effect transistor may be a vertical structure that does not extend along the entire length of the merged source-drain structure (consisting of the source-drain regions for the respective fins of the transistor). Related art processes for fabricating self-aligned source-drain (SD) contacts with low parasitic capacitance may expose the gate spacers (which may be composed of nitride) to an oxide etch twice: first for the opening of the long SD contact trench used to form a metal layer on the SD structures, and second for the opening of the shorter SD contact trench used for forming a vertical contact to the metal layer. Marginal etch selectivity of the dielectric SD contact trench fill (e.g. oxide) to gate spacer (e.g. nitride), may result in a risk of damaging the spacers.

Thus, there is a need for an improved method for forming low parasitic capacitance source and drain contacts.

SUMMARY

Aspects of embodiments of the present disclosure are directed toward a method for forming a low parasitic capacitance contact to a source-drain structure of a fin field effect transistor device. In some embodiments the method includes etching a long trench down to the source-drain structure, the trench being sufficiently long to extend across all the of source-drain regions of the device. A conductive layer is formed on the source-drain structure, and the trench is filled with a first fill material. A second, narrower trench is opened along a portion of the length of the first trench, and filled with a second fill material. The first fill material may be conductive, and may form the contact. If the first fill material is not conductive, a third trench may be opened, in the portion of the first trench not filled with the second fill material, and filled with a conductive material, to form the contact.

According to an embodiment of the present invention there is provided a method for fabricating a source-drain contact for a fin field effect transistor (FinFET) device having a plurality of fins, and a source-drain structure, the method including: etching a first trench to the source-drain structure, the first trench having a first length in a first direction, forming a first conductive layer in the first trench, on the source-drain structure; forming an etch-stop layer in the first trench, on the first conductive layer; filling the first trench with a first fill material; forming a mask over a first portion of the first fill material, the mask not extending over a second portion of the fill material; etching, with an anisotropic etch, the second portion of the first fill material to form a second trench having a second length, less than the first length, in the first direction; and filling the second trench with a second fill material, the second fill material being a dielectric.

In one embodiment, the source-drain structure includes a plurality of source-drain regions, each of the source-drain regions corresponding to one of the plurality of fins, wherein the first conductive layer overlaps a portion of each of the source-drain regions.

In one embodiment, the first fill material includes, as a major component, a semiconductor.

In one embodiment, the first fill material includes, as a major component, a semiconductor selected from the group consisting of: silicon, silicon-germanium, germanium, and combinations thereof.

In one embodiment, the etch-stop layer includes, as a major component, an oxide.

In one embodiment, the etch-stop layer includes, as a major component, an oxide selected from the group consisting of: silicon dioxide, aluminum oxide, and combinations thereof.

In one embodiment, the first fill material includes, as a major component, tungsten.

In one embodiment, the etch-stop layer includes, as a major component, a conductor.

In one embodiment, the method includes, after the filling a remainder of the first trench with the first fill material, planarizing a top surface of the first fill material.

In one embodiment, the method includes, after the etching, with the anisotropic etch, of the second portion of the first fill material, removing the mask.

In one embodiment, the etching, with the anisotropic etch, of the second portion of the first fill material to form the second trench, includes removing at least 90% of the first fill material in the second portion.

In one embodiment, the method includes, after the filling of the second trench with the second fill material, planarizing a top surface of the second fill material.

In one embodiment, the method includes, after the filling of the second trench with the second fill material, etching the first portion of the first fill material to form a third trench having a third length, less than the first length, in the first direction.

In one embodiment, the method includes, after the forming of the third trench, filling the third trench with a third fill material, the third fill material being a conductor.

In one embodiment, the method includes, after the forming of the third trench, and before the filling of the third trench with the third fill material, removing the etch-stop layer from a bottom of the third trench.

In one embodiment, the third fill material includes, as a major component, a conductor selected from the group consisting of: tungsten, cobalt, and combinations thereof.

In one embodiment, the method includes, after the forming of the third trench, and before the filling of the third trench with the third fill material, forming a conductive liner in the third trench.

In one embodiment, the conductive liner includes, as a major component, a material selected from the group consisting of: titanium, titanium nitride, and combinations thereof and the third fill material includes, as a major component, a material selected from the group consisting of: tungsten, cobalt, and combinations thereof.

According to an embodiment of the present invention there is provided a method for fabricating a source-drain contact for a fin field effect transistor (FinFET) device having a plurality of fins, and a source-drain structure, the method including: etching a first trench to the source-drain structure, the first trench having a first length in a first direction, forming a first conductive layer in the first trench, on the source-drain structure; forming an etch-stop layer in the first trench, on the first conductive layer; filling the first trench with a first fill material; forming a mask over a first portion of the first fill material, the mask not extending over a second portion of the fill material; etching, with an anisotropic etch, the second portion of the first fill material to form a second trench having a second length, less than the first length, in the first direction; and filling the second trench with a second fill material, the second fill material being a dielectric, wherein the first fill material includes, as a major component, a material selected from the group consisting of: silicon, silicon-germanium, germanium, and combinations thereof, and wherein the etch-stop layer includes, as a major component, a material selected from the group consisting of: silicon dioxide, aluminum oxide, and combinations thereof.

According to an embodiment of the present invention there is provided a method for fabricating a source-drain contact for a fin field effect transistor (FinFET) device having a plurality of fins, and a source-drain structure, the method including: etching a first trench to the source-drain structure, the first trench having a first length in a first direction, forming a first conductive layer in the first trench, on the source-drain structure, the first conductive layer including: as a major component, a material selected from the group consisting of titanium silicide, nickel silicide, cobalt silicide, and combinations thereof, or a bi-layer including: a lower sub-layer including, as a major component, a silicide; and an upper layer, including, as a major component, a conductive nitride; forming a conductive etch-stop layer in the first trench, on the first conductive layer, the forming of the etch-stop layer including a chemical vapor deposition process and/or a physical vapor deposition process, the etch-stop layer including, as a major component, cobalt; forming a first liner in the first trench, the forming of the first liner including a chemical vapor deposition process and/or a physical vapor deposition process; filling the first trench with a first fill material including, as a major component, tungsten; forming a mask over a first portion of the first fill material, the mask not extending over a second portion of the fill material; etching, with an anisotropic etch, the second portion of the first fill material to form a second trench having a second length, less than the first length, in the first direction; filling the second trench with a second fill material, the second fill material being a dielectric; etching the first portion of the first fill material to form a third trench having a third length, less than the first length, in the first direction; forming a second liner in the third trench, the forming of the second liner including a chemical vapor deposition process and/or a physical vapor deposition process, the second liner including, as a major component, a material selected from the group consisting of: titanium, titanium nitride, and combinations thereof and filling the third trench with a third fill material, the third fill material including, as a major component, a material selected from the group consisting of tungsten, cobalt, and combinations thereof.

BRIEF DESCRIPTION OF THE DRAWINGS

These and other features and advantages of the present invention will be appreciated and understood with reference to the specification, claims, and appended drawings wherein:

FIG. 5 is an intermediate structure formed during a process for forming a source-drain contact structure, according to an embodiment of the present invention;

FIG. 6 is an intermediate structure formed during a process for forming a source-drain contact structure, according to an embodiment of the present invention;

DETAILED DESCRIPTION

Figure 2:
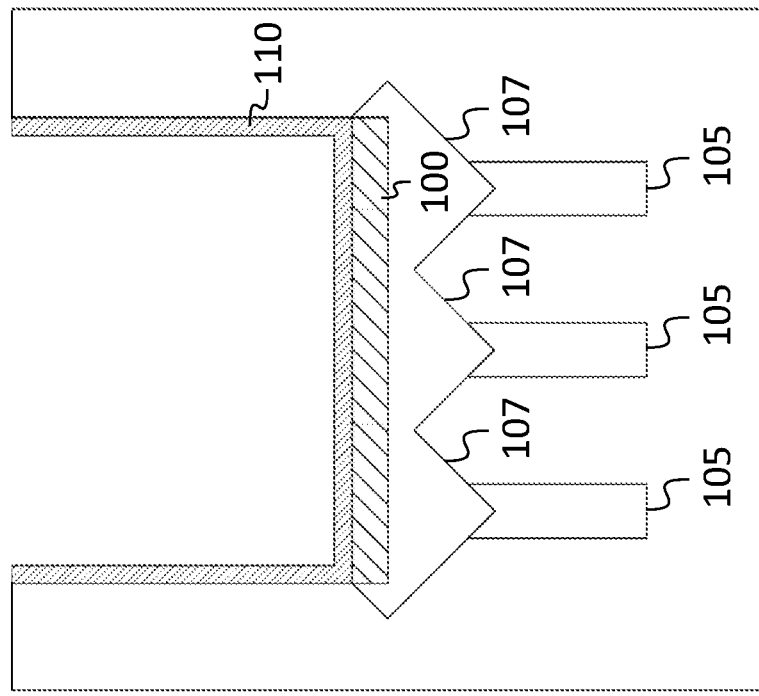
FIG. 2 is an intermediate structure formed during a process for forming a source-drain contact structure, according to an embodiment of the present invention.

The detailed description set forth below in connection with the appended drawings is intended as a description of exemplary embodiments of a method for forming low parasitic capacitance source and drain contacts provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Embodiments of the present invention relate to methods for fabricating source-drain (SD) contact structures. Although some embodiments are disclosed for the fabrication of source-drain contacts for multiple fin field effect transistor (FinFET) devices with merged SD structures, the same methods, or analogous methods, may be used in the fabrication of other devices (such as horizontal nanowires or horizontal nano-sheets, or multiple FinFET devices with unmerged SD structures).

Related art processes for fabricating self-aligned SD contacts with low parasitic capacitance may expose the gate spacers (which may be composed of nitride) to an oxide etch twice: first for the opening of the long SD contact trench used to form a metal layer on the SD structures, and second for the opening of the shorter SD contact trench used for forming a vertical contact to the metal layer. Marginal etch selectivity of the dielectric SD contact trench fill (e.g. oxide) to gate spacer (e.g. nitride), may result in a risk of damaging the spacers. Embodiments of the present invention reduce this risk by using only one oxide etch, to open the long SD contact trench. A fill material may then be used that is suitable for etching with a more highly selective etch, reducing the risk to the spacers in the second etch.

As used herein, an anisotropic etch refers to an etch that can etch preferentially in the vertical direction, without much lateral under-etch, e.g. forming walls at angles of 75-90 degrees from horizontal surfaces. These anisotropic etches may be performed by reactive ion etching (RIE), and both terms are used interchangeably herein; it will be understood that that where a reactive ion etch is mentioned another suitable anisotropic etch may be employed instead.

While two principal embodiments are described in detail, each with a number of possible variations, it will be understood that many other implementations are possible. In general, the methods claimed may be applied for different materials used as first fill material, with the key material property being that the first fill material is chosen from materials that can be etched by RIE (reactive ion etching) with high selectivity with respect to the spacer material (e.g., SiN). First fill material with etch selectivity of at least 2.5:1, or at least 4:1 with respect to oxides (i.e. first fill material that can be etched by RIE with some selectivity to oxides) may be used. First fill material having high etch selectivity (i.e. at least 4:1, or at least about 6:1, in some embodiments at least 10:1) with respect to the etch stop layer (ESL) may be used (e.g. if an oxide is used as ESL, then a first fill material with high etch selectivity to oxides may be used).

A last portion of removal of the first fill material (at any step in which the first fill material is being removed) may be achieved by a wet etch if this offers higher selectivity than the RIE. An anisotropic etch-back step may involve the use of a two step etch-back process sequence, using an anisotropic etch-back step first, followed by an isotropic etch-back second. In this case, the last isotropic etch may be designed to etch only a small portion of the first fill material, in some embodiments less than about 15 nm, or less than about 10 nm. This may be useful when the selectivity of the isotropic etch (ability of etching the first fill material without etching the ESL) is significantly higher than that of the anisotropic etch.

The SD regions 107 (FIG. 1) may be formed of semiconductor materials, such as Si, Si—Ge alloys or other semiconductors. As used herein "silicide" refers to any intermetallic compound formed by reaction of a metal with the semiconductor material in the SD regions 107; the term is not limited to Si-intermetallic compounds (that absent the present definition may be considered silicides), but includes also germano-silicides, and intermetallic alloys of other semiconductors as well. As used herein a "self-aligned silicide" or "SALICIDE" process, refers to generally a process involving a thermal reaction of a metal with the semiconductor forming a metallic semiconductor-metal intermetallic compound, a selective removal (e.g. etch) of un-reacted materials and other possible products of the reaction other than the metallic semiconductor-metal intermetallic compound (e.g. nitrides), said selective removal being selective to (i.e. not attacking) the metallic semiconductor-metal intermetallic compound; with a second thermal reaction performed after said selective removal step being optional.

Only key steps in the respective process flows are shown, to allow one of skill in the art to implement a corresponding, complete fabrication flow. Many variations are possible, as will be understood by one of skill in the art.

It will also be understood that when depositing a layer at the bottom of a trench, without significant deposition of the layer on the sidewall, that a directional deposition technique is used (i.e. as directional physical vapor deposition (PVD)). Throughout this disclosure, unless otherwise indicated, a PVD deposition refers to a highly directional PVD deposition.

FIGS. 1-10 show a set of simplified schematic drawings of a process, or a fabrication flow, for one embodiment. The drawings are simplified and dimensions are not drawn to scale. An example showing a device with three fins 105 is illustrated, but the method is applicable to any multiple fin device, with 2, 3, 4 fins, etc. (as well as other devices such as horizontal nanowire (NW), etc.). Each fin 105 may have a corresponding source-drain region 107; these regions may be merged together to form a single source-drain structure as shown.

FIGS. 1-10 show cross sectional views, for a cutting plane along an SD region, perpendicular to current flow in the fin channels. The initial fabrication flow may include, initially, fin formation, dummy gate and spacer formation, SD formation, replacement metal gate (RMG) module, and SD (long) contact trench opening. After SD contact trench opening, a conductive layer 100 may be formed at the bottom of the SD contact trench opening. In some embodiments, a silicide process can be used to form the conductive layer 100 at the bottom of the SD contact trench. Different options for forming the conductive layer at the bottom of the contact trench are possible. In some embodiments, after the formation of the conductive layer 100 at the bottom of the contact trench, there are no conductive layers on the inner sidewalls of the bottom region of the contact trench opening.

Examples of a process for the formation of the conductive layer 100 at the bottom of the contact trench include embodiments in which a self-aligned silicide (SALICIDE) process is used (such as Ti-SALICIDE, or Co-SALICIDE or Ni-SALICIDE). In other embodiments, a liner metal (such as titanium (Ti)) is deposited by PVD with an optional titanium nitride (TiN) cap also deposited by PVD; for these embodiments, the shape of the trench sidewalls may be such that the PVD depositions do not result in a significant amount of conductive material on the sides of the bottom regions of the trenches (e.g. as for trenches with walls that are substantially vertical). In some embodiments, some amount of conductive material may be deposited on the sidewalls of the contact trench opening and may form a conductive layer on the sidewalls (for example, a chemical vapor deposition (CVD) Ti deposition may be used; or a PVD Ti deposition followed by a CVD TiN deposition may be used); in this case, the conductive material present at the sidewalls of the Region B (FIG. 5) is removed in step 5 (discussed in further detail below).

Figure 1:
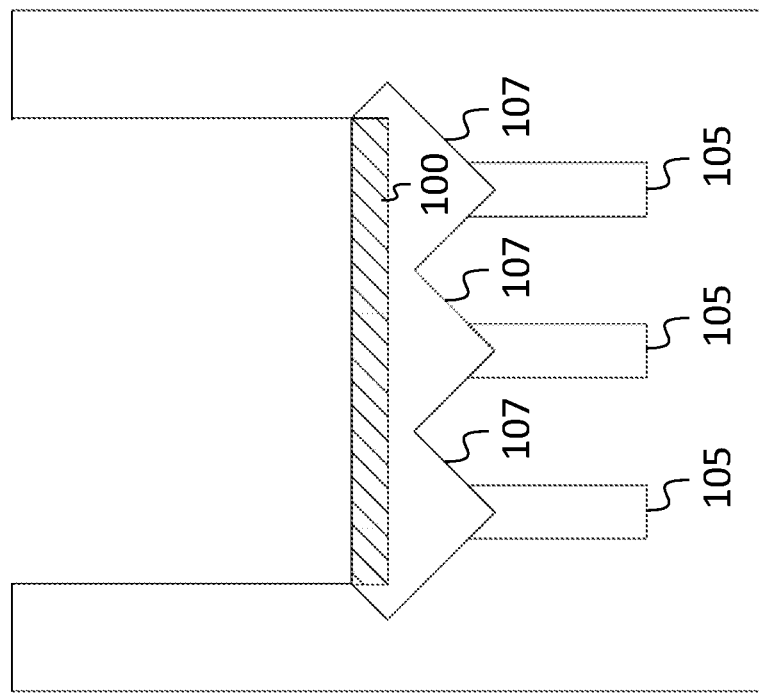
FIG. 1 is an intermediate structure formed during a process for forming a source-drain contact structure, according to an embodiment of the present invention.

In the description of FIGS. 1-10, each step number identifies a process step resulting in the structure shown in the drawing with the same number; for example, step 5 is the step resulting in the structure of FIG. 5. Referring to FIG. 1, after step 1, the conductive material at the bottom of the trench may be a silicide, a silicide with a TiN cap layer, or a metal such as Ti with a TiN cap, etc. In embodiments in which a metal is deposited in contact with the semiconductor SD regions (when forming the conductive layer 100), and without a thermal process to form a silicide within this step, a thermal step to form a silicide (by reaction of the metal and semiconductor) may be carried at other subsequent steps in the flow. The bottom conductive layer 100 may be about 2 nm to about 10 nm thick. In some embodiments, the bottom conductive layer 100 is about 5 nm to about 20 nm thick. In some embodiments, the bottom conductive layer 100 has a sheet resistance lower than about 600 ohm/square (ohm/sq). In some embodiments, the bottom conductive layer 100 has a sheet resistance lower than about 300 ohm/sq.

Referring to FIG. 2, in a subsequent step (step 2), a dielectric etch-stop layer (ESL) 110, e.g., an oxide layer, is formed in the SD contact trench opening. The ESL is chosen from materials and of a thickness such that it can effectively stop (with enough selectivity) a silicon (Si) etch. In some embodiments the etch-stop layer 110 is formed by a conformal deposition, and also forms on the sides of the trench (as shown in FIG. 2). In some embodiments, non-conformal deposition processes may be used and the ESL 110 may form only at the bottom of the trenches. In some embodiments, the ESL may include, as a major component, silicon oxide (e.g., SiO2), or aluminum oxide (e.g., Al2O3), or other oxides or insulating nitrides. In some embodiments, formation of the ESL 110 does not significantly degrade the conductivity of the bottom conductive layer 100. The etch-stop layer 110 may be between about 1 and 8 nm thick.

Figure 3:
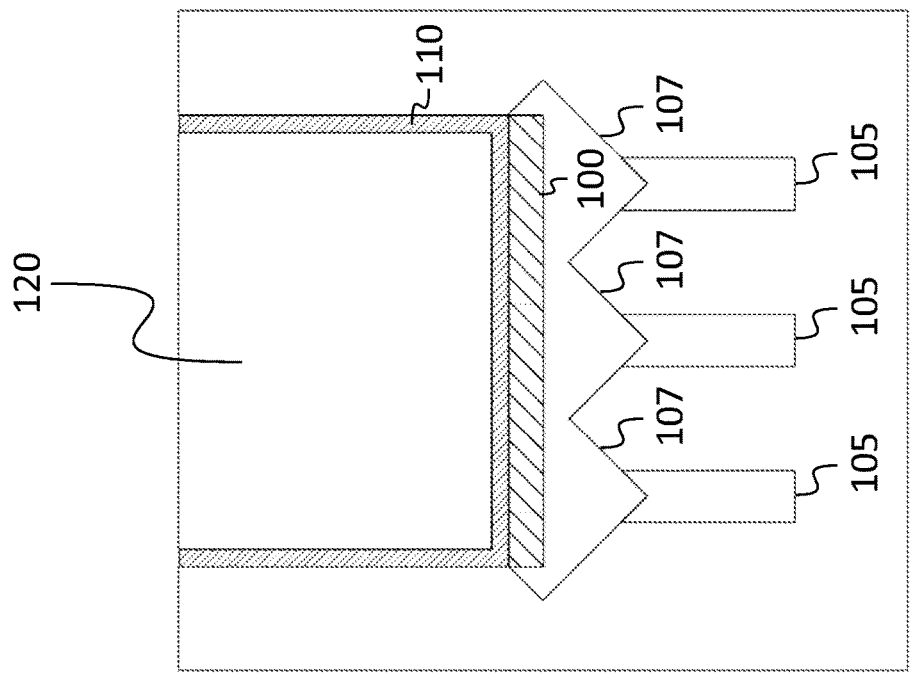
FIG. 3 is an intermediate structure formed during a process for forming a source-drain contact structure, according to an embodiment of the present invention.

Referring to FIG. 3, in a subsequent step (step 3), the rest of the SD contact trench opening may be filled with a fill material 120 that may be an amorphous or polycrystalline semiconductor material or a combination thereof. In some embodiments, the deposition of the fill material is performed at temperatures under 500° C. In some embodiments, the deposition of the fill material is performed at temperatures under 400° C. In some embodiments the fill material is Si (amorphous silicon (a-Si) or polycrystalline silicon (poly-Si) or a combination thereof). In some embodiments the fill material is chosen from amorphous Si, amorphous germanium (Ge), amorphous Si—Ge alloys, polycrystalline-Si, polycrystalline-Ge, a polycrystalline-Si—Ge alloy, or a combination thereof. Appropriate planarization steps may also be employed in step 3, to produce the structure of FIG. 3.

Figure 4:
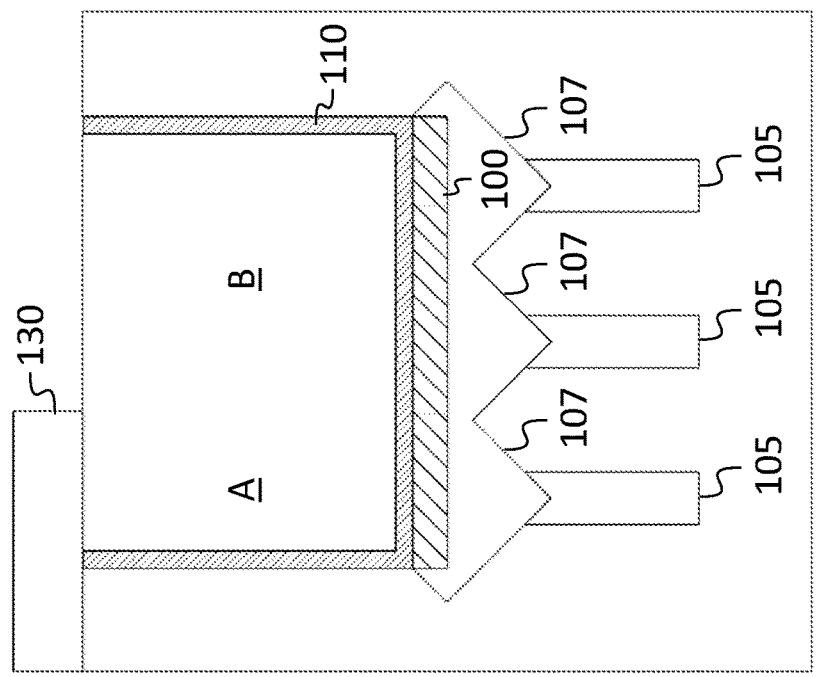
FIG. 4 is an intermediate structure formed during a process for forming a source-drain contact structure, according to an embodiment of the present invention.

Referring to FIG. 4, in a subsequent step (step 4), a mask 130 is formed using suitable techniques, including, for example, lithographic patterning to cover a portion of the contact trench (Region A, also illustrated in FIG. 5). The steps used to form the mask 130, and the intermediate structures formed in these steps, are not separately illustrated. The mask 130 may extend through the full contact trench in the direction perpendicular to the plane of the drawing. The mask 130, thus, divides the contact trench into two regions (also illustrated in FIG. 5), Region A (the region below the mask 130) and Region B (the region not below the mask 130). The dimensions of these two regions (in a first direction, that is a horizontal direction in the plane of the drawing, indicated in FIG. 5 as LA and LB), may be selected to adjust the AC performance of a specific circuit.

Referring to FIG. 5, in a subsequent step (step 5), an anisotropic etch is performed to remove the Si from the unmasked Region B, forming a second trench. In some embodiments, the etch stops appropriately on the ESL 110, without substantially punching through and without substantially removing the bottom conductive layer 100 from the bottom of Region B. In some embodiments, the conductive layer 100 may have been degraded by the deposition of the dielectric ESL 110 or by the etch of Region B; in these embodiments, an additional PVD metal deposition may be used at this step to lower the sheet resistance of the bottom conductive layer, with care taken to avoid depositing any substantial amount of conductive material on the bottom of the Region B (to avoid significantly increasing the parasitic capacitance).

Steps 4 and 5 as described above represent only one option of many possible options to implement embodiments of the present invention. The location and size of the parts of the SD trench contacts that are masked may vary and may be adjusted to achieve various AC performance benefits, the number of masks employed, the process cost, etc. Furthermore, different designs may be adopted for source and for drain structures (i.e. design of masked regions comprising Region A for the source may be different than for the drain). Furthermore, in some designs, the method described herein is applied to only one side of the transistor, i.e. either to the source or to the drain, but not to both. In some designs the mask may cover the whole source contact trench so that the Region A in the source comprises the whole source contact trench, while only parts of the drain contact trench region are masked. In some designs the mask may cover the whole drain contact trench so that the Region A in the drain comprises the whole drain contact trench, while only parts of the source contact trench are masked. Furthermore, the design and masks can be adjusted separately for different devices in the circuit, so that different devices, for example in different cells, may have different designs of the Regions A and Regions B. Furthermore, the embodiments of the present invention may be applied to some devices of an integrated circuit and not to other devices in the same integrated circuit (i.e. for the device in the latter case, the whole source and drain contact trenches are masked). As will also be appreciated by one of skill in the art, the number of patterning steps may be more than one (e.g. if different colors are used for the specific pattern), so different combinations of process steps may be combined to achieve the desired pattern transferred into the structure.

Figure 7:
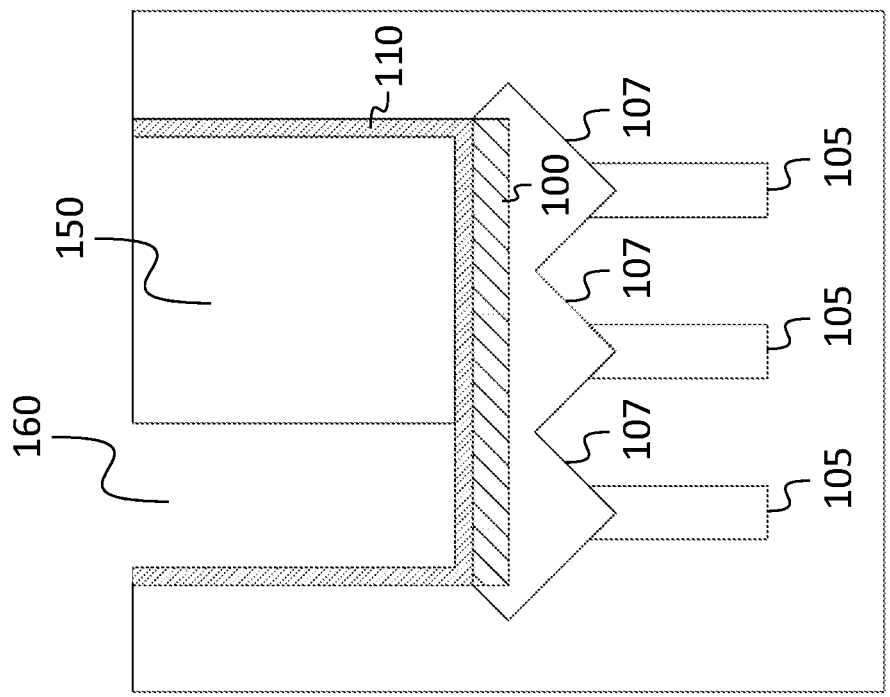
FIG. 7 is an intermediate structure formed during a process for forming a source-drain contact structure, according to an embodiment of the present invention.

Referring to FIG. 6, in a subsequent step (step 6), the mask 130 is removed, Region B is filled with a dielectric 150 such as SiO2, followed by appropriate planarization steps. Referring to FIG. 7, in a subsequent step (step 7), Si from Region A is etched back, forming a third trench, or partial SD contact opening 160, with the etch stopping on the ESL 110.

Figure 8:
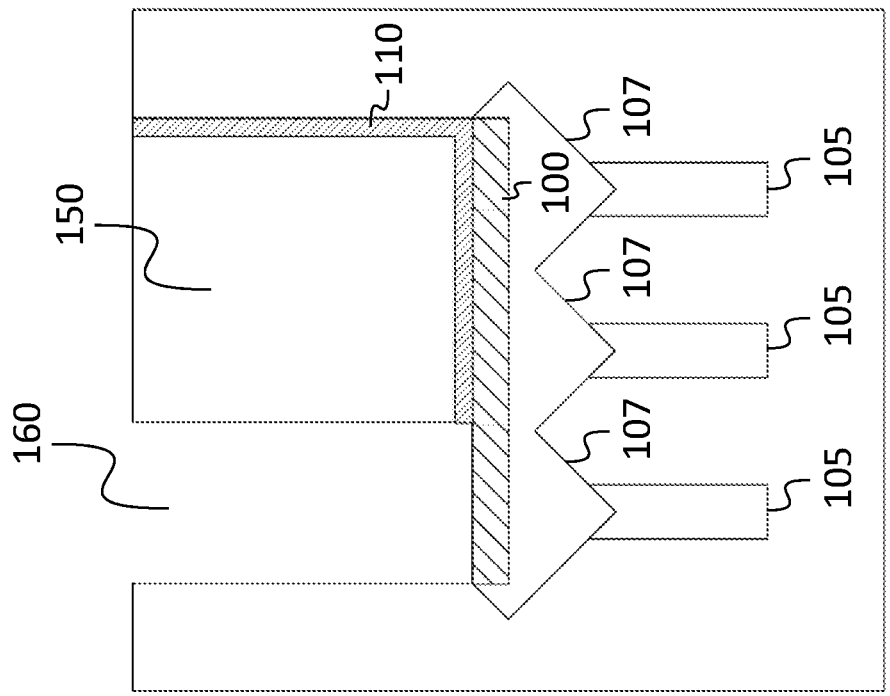
FIG. 8 is an intermediate structure formed during a process for forming a source-drain contact structure, according to an embodiment of the present invention.

Referring to FIG. 8, in a subsequent step (step 8), the ESL 110 is removed from the bottom of the partial SD contact opening 160. In some embodiments, the removal of the ESL layer 110 from the bottom of the partial SD contact opening 160 is done selectively to the bottom conductive layer 100. In some embodiments, the removal of the ESL 110 from the bottom of the partial SD contact opening 160 does not degrade the conductivity of the bottom conductive layer 100 in the region of the partial SD contact opening 160 by more than 20%. In some embodiments, the removal of the ESL 110 from the bottom of the partial SD contact opening 160 does not degrade the conductivity of the bottom conductive layer 100 in the region of the partial SD contact opening 160 by more than 50%.

Figure 10:
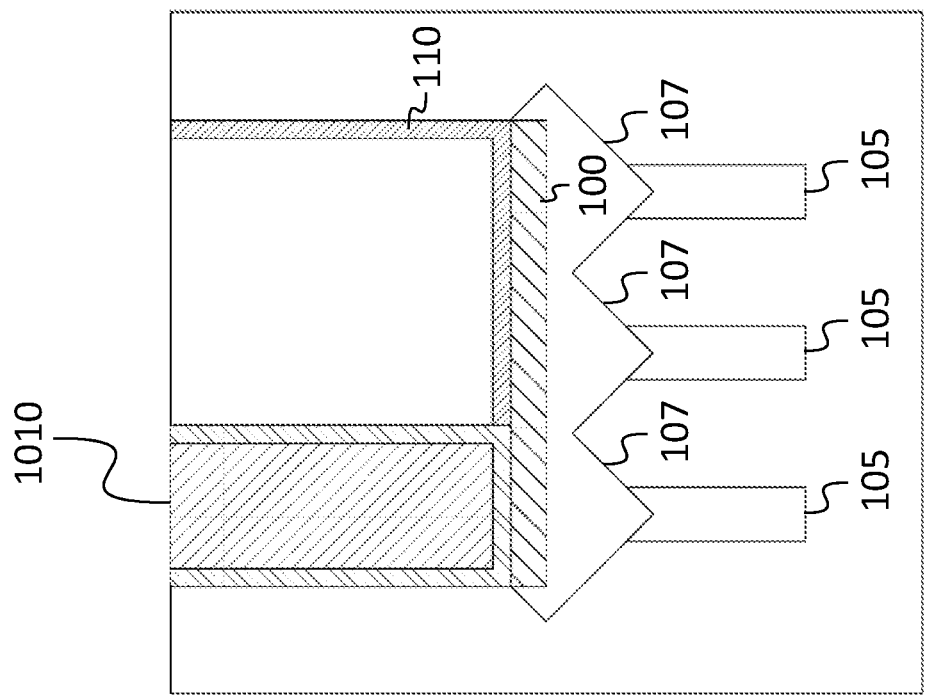
FIG. 10 is an intermediate structure formed during a process for forming a source-drain contact structure, according to an embodiment of the present invention.
Figure 9:
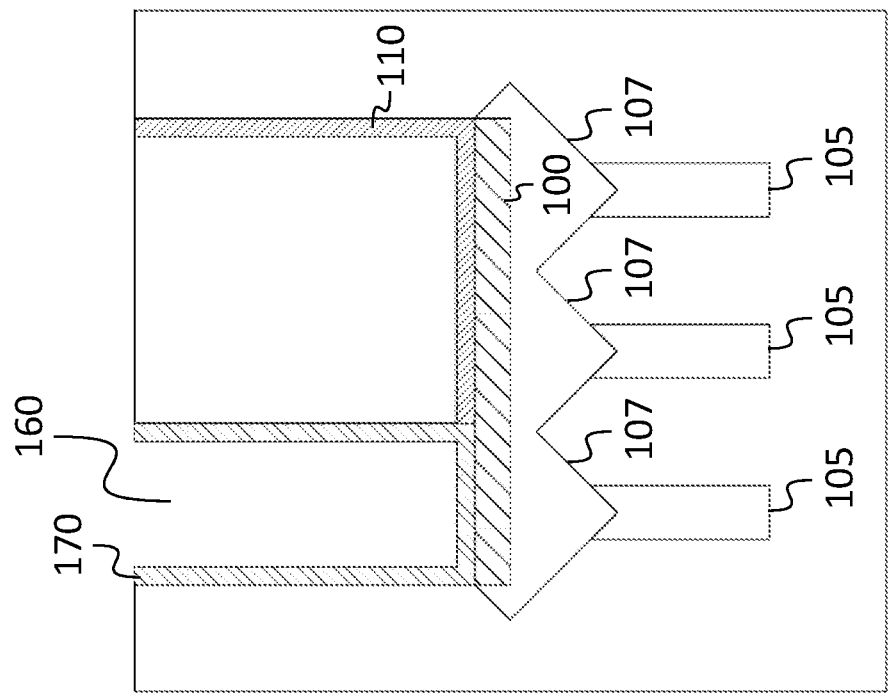
FIG. 9 is an intermediate structure formed during a process for forming a source-drain contact structure, according to an embodiment of the present invention.

Referring to FIGS. 9 and 10, in subsequent steps (steps 9 and 10), a contact is formed in the partial SD contact opening 160 to provide a conductive path to the bottom conductive layer 100. Appropriate cleaning steps may be used to ensure that the contact provides a low resistance path to the bottom conductive layer 100. A contact liner 170 may be deposited in step 9 in some embodiments, using, for example, PVD Ti, chemical vapor deposition (CVD) Ti or CVD TiN, or a combination thereof, or other materials. Particularly, in embodiments in which the removal of the ESL 110 from the partial SD contact opening 160 results in degradation of the properties of the bottom conductive layer 100 in the region of the partial SD contact opening 160, a new bottom conductive layer may be formed at the bottom of the partial SD contact opening 160 at this step, optionally followed by the deposition of a contact liner 170.

Referring to FIG. 10, in a step (step 10) subsequent to step 9, contact metal fill 1010 follows to complete formation of the contact. Cobalt (Co) or tungsten (W) metal fills may be used, as well as other metals. Planarization steps may be performed after the formation of the contact. The rest of the fabrication flow may follow according to related art methods.

FIGS. 11-18 show a set of simplified schematic drawings of a process, or a fabrication flow, for another embodiment. The initial fabrication flow may include, initially, fin formation, dummy gate and spacer formation, SD formation, replacement metal gate (RMG) module, and SD contact trench opening. After SD contact trench opening, a metal layer 200, such as Ti is formed in the contact trench opening (e.g. by PVD or CVD) followed by an optional metallic liner 205, formed by and of a process and material such as PVD TiN, CVD Ti or CVD TiN. The metal layer 200 may be formed preferentially at the bottom of the SD contact trench opening (e.g. using a directional PVD technique). The liner 205 may be formed at the bottom only (using a directional PVD) or at the bottom and sides of the contact trench opening using conformal deposition techniques. The metal layer 200 may be reacted at any step in the flow after its formation to form a silicide. In some embodiments, the silicide reaction is performed right after deposition of a Ti layer (with optional TiN cap) and the process results in a Ti-silicide and a TiN capping layer which may remain as a liner material. In some embodiments, the silicide reaction is performed right after deposition of a directional PVD Ti layer (with optional directional PVD TiN cap), and the process results in a Ti-silicide and a TiN capping layer formed only at the bottom of the contact trench opening. In some embodiments, a SALICIDE process is used and no significant amount of metallic material remains at the sidewalls. In some embodiments, deposition of a CVD liner material is used as well. Although in FIG. 11, the liner 205 is shown as forming both at the bottom and on the sides of the SD contact trench opening, in some embodiments it only is formed preferentially at the bottom of the contact trench.

When directional PVD depositions are used (e.g. for metal layer 200 or liner 205), the metal deposited forms a film at the bottom surface of the SD contact trench, and it also forms a film on top of the flat surfaces at the top level of the structure, and may form a film on the sidewalls of the upper most portion of the SD contact trench opening (this uppermost portion of the SD contact trench opening may be a portion extending about 5 nm to about 40 nm as measured from the top of the SD contact trench opening, in some embodiments); and may form substantially no film (in some embodiments less than about 1 nm, in some embodiments less than about 2 nm, and in some embodiments no detectable film (e.g. not detectable by TEM)) on the sidewalls of the bottom portion (in some embodiments, the bottom portion of the SD contact trench opening extends vertically to about 10 nm to about 40 nm above the bottom surface of the SD contact trench opening) of the SD contact trench opening.

As used herein, references to a film being formed preferentially at the bottom of the trench by a directional deposition technique such as PVD mean that the film has the characteristics described immediately above. As used herein, references to the bottom of the SD contact trench opening mean the bottom surface inside the SD contact trench opening, a surface that may be flat or curved. As used herein, references to the upper region or upper portion or uppermost region or uppermost portion of the SD contact trench opening mean the region or portion of the SD contact trench opening closer to the top of the structure, e.g., of a vertical length of about 5 nm to about 40 nm as measured from the top of the structure, but not extending down to the top of the metal gate (i.e. the lowest point of the upper region of the SD contact trench opening being above (by at least about 5 nm to about 20 nm) the top of the metal gate). As used herein, references to the bottom region or bottom portion or bottommost region or bottommost portion of the SD contact trench opening refer to the region or portion of the SD contact trench opening closer to the bottom of the structure, e.g., of a vertical length of about 10 nm to about 40 nm as measured from the bottom of the structure. The bottom region of the SD contact trench opening may be at least as tall as the metal gate (i.e. at least of about the same vertical height as the metal gate, and in some embodiments, taller than the metal gate by at least about 5 nm).

In situations in which the upper and bottom portions of the SD contact trench opening overlap (e.g., if the total SD contact trench height is of less than about 80 nm), and only in these situations, the bottom portion of the SD contact trench opening is defined herein to mean the portion extending from the bottom of the structure to about 5 nm above the top of the metal gate structure, and the upper region of the SD contact trench opening is defined herein to mean the region extending from about 5 nm above the top of the metal gate structure to the top of the SD contact trench structure.

The metal layer 200 may be about 2 to 10 nm thick. In some embodiments, the metal layer 200 is about 5 nm to about 20 nm thick. In some embodiments, the metal layer 200 has a sheet resistance lower than about 600 ohm/sq. In some embodiments, the metal layer 200 has a sheet resistance lower than about 300 ohm/sq.

In the description of FIGS. 11-18 each step number identifies a process steps resulting in the structure shown in the drawing having a figure number exceeding the step number by 10. Accordingly, for example, step 2 is the step resulting in the structure illustrated in FIG. 12.

Figure 12:
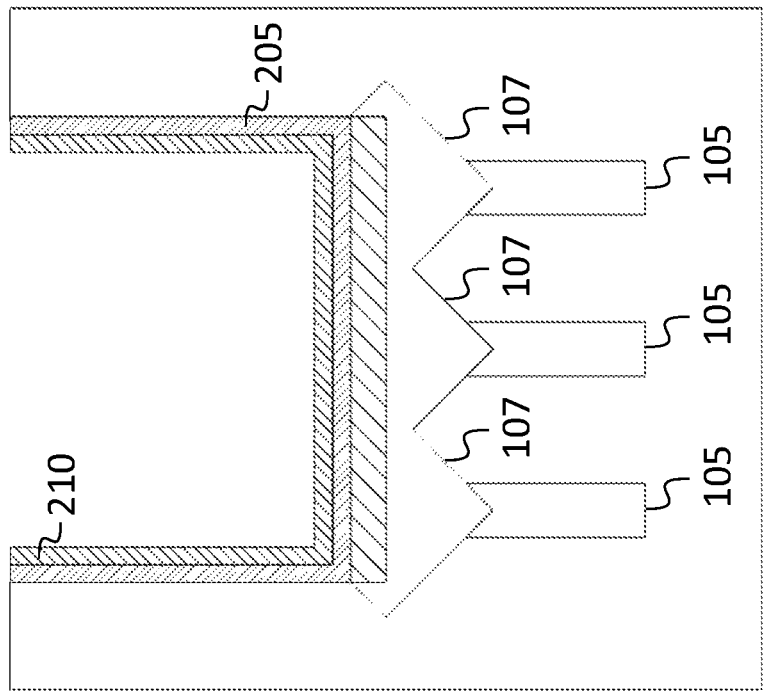
FIG. 12 is an intermediate structure formed during a process for forming a source-drain contact structure, according to an embodiment of the present invention.
Figure 11:
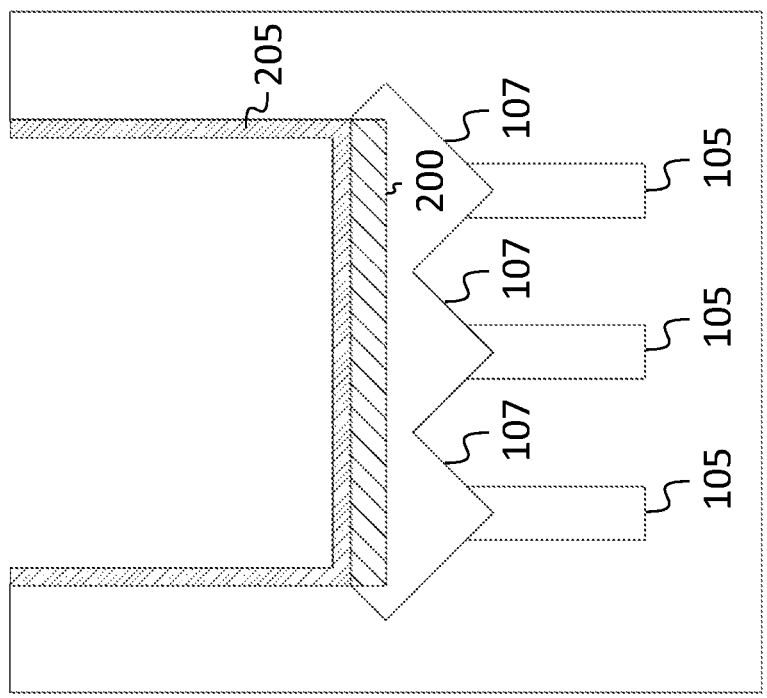
FIG. 11 is an intermediate structure formed during a process for forming a source-drain contact structure, according to an embodiment of the present invention.

Referring to FIG. 12, in a subsequent step (step 2), a conductive etch-stop layer (ESL) 210 is formed in the SD contact trench opening. The conductive ESL 210 is chosen from materials and of a thickness such that it can effectively stop (with enough selectivity) a W etch. In some embodiments the etch-stop layer 210 is formed by a conformal deposition, and forms also on the sides of the trench (as shown in the drawing). In some embodiments, non-conformal deposition processes may be used and the conductive ESL 210 only forms at the bottom of the trench (or forms preferentially at the bottom of the trench). In some embodiments, the ESL 210 may be include Co as a major component. In some embodiments, formation of the conductive ESL 210 does not significantly degrade the conductivity of the bottom conductive layers (metal layer 200 and liner 205). Care (such as proper cleaning operations, or clustering of deposition systems, or proper queue times) may be taken when forming the conductive ESL to provide a good low resistivity interface to the underlying metal or silicide. The conductive etch stop layer 210 may be between about 2 nm and about 6 nm thick.

In some embodiments, a CVD process may be used to deposit the conductive ESL 210 substantially without having a liner 205 on the sidewalls of bottom region of the SD contact trench opening (e.g., when no liner was deposited (i.e. formation of layer 205 was skipped), or when a directional PVD deposition was used to form the liner 205, or when the liner 205 was formed by a silicidation process in a nitrogen (N2) environment, or in a nitriding environment, so that a metal nitride was formed on top of metal layer 200); in some embodiments this may result in poor formation of the layer 210 on the sidewalls of the bottom region of the SD contact trench opening. For example, CVD may have some conformality, and may result in some deposition on the sidewalls. But in some cases, CVD films may grow well only on liners (e.g., because of nucleation issues). So, if there is no liner on the sidewalls, the CVD process may be ineffective to form a good layer on the sidewalls (but since there is a liner on the bottom, the CVD process may nonetheless be effective in forming a layer on the bottom).

Figure 13:
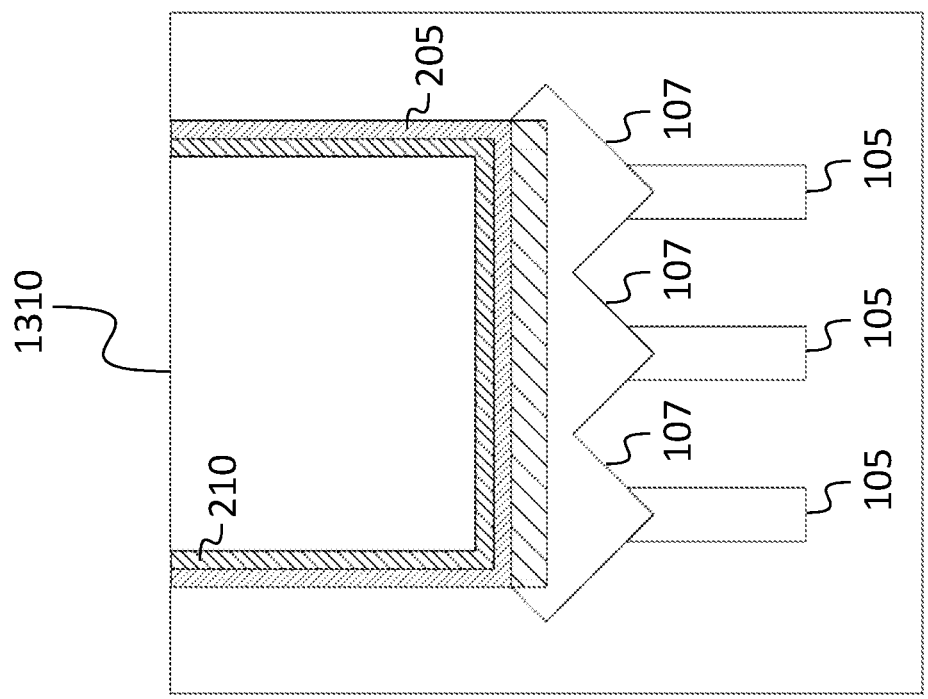
FIG. 13 is an intermediate structure formed during a process for forming a source-drain contact structure, according to an embodiment of the present invention.

Referring to FIG. 13, in a subsequent step (step 3), the rest of the SD contact trench opening is filled with W 1310, followed by appropriate planarization steps. An additional metallic liner material (such as TiN) may be deposited in some embodiments after formation of the conductive ESL 210 (i.e. after step 2) and before the W 1310 deposition. In some embodiments, filling the SD contact trench opening comprises forming a liner layer such as TiN using a conformal deposition technique such as CVD TiN, and then proceeding to complete the filling with W 1310 (the formation of the W fill 1310 may involve more than one deposition, using different methods, techniques or precursors to deposit the W 1310).

Figure 14:
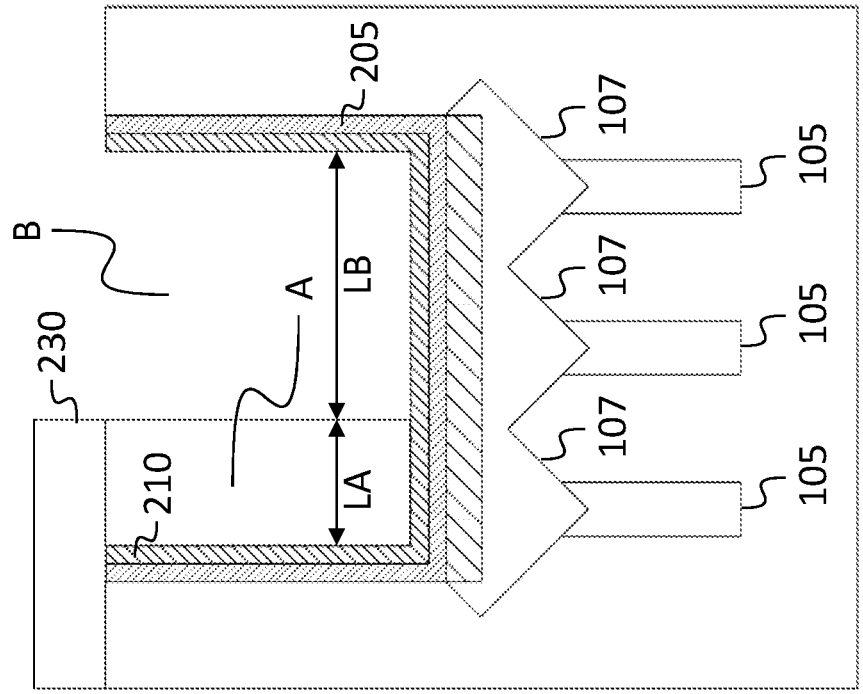
FIG. 14 is an intermediate structure formed during a process for forming a source-drain contact structure, according to an embodiment of the present invention.

Referring to FIG. 14, in a subsequent step (step 4), a mask 230 is formed, using suitable techniques, e.g., lithographic patterning, to cover a portion of the contact trench (Region A). The steps used to form the mask 230, and the intermediate structures formed in these steps, are not separately illustrated. The mask 230 may extend through the full contact trench in the direction perpendicular to the plane of the drawing. The mask 230, thus, divides the contact trench into two regions, Region A (the region below the mask 230) and Region B (the region not below the mask 230). The dimensions of these two regions (in a horizontal direction in the plane of the drawing, indicated in FIG. 14 as LA and LB), may be selected to adjust the AC performance of a specific circuit.

An anisotropic etch is then performed to remove W from the unmasked region, stopping on the conductive ESL 210. The drawing is shown after the W etch-back. Mask removal follows.

Step 4 as described above represents only one option of many possible options to implement embodiments of the present invention. The location and size of the parts of the SD trench contacts that are masked (all combined comprising 'Region A', and the rest of the SD trench contact remaining unmasked comprising 'Region B') may vary and may be adjusted to achieve various AC performance benefits, the number of masks employed, the process cost, etc. Furthermore, different designs may be adopted for source and for drain structures (i.e. design of masked regions comprising Region A for the source may be different than for the drain). Furthermore, in some designs, the method described herein is applied to only one side of the transistor, i.e. either to the source or to the drain, but not to both. In some designs the mask may cover the whole source contact trench so that the Region A in the source comprises the whole source contact trench, while only parts of the drain contact trench region are masked. In some designs the mask may cover the whole drain contact trench so that the Region A in the drain comprises the whole drain contact trench, while only parts of the source contact trench are masked. Furthermore, the design and masks can be adjusted separately for different devices in the circuit, so that different devices, for example in different cells, may have different designs of the Regions A and Regions B. Furthermore, the embodiments of the present invention may be applied to some devices of an integrated circuit and not to other devices in the same integrated circuit (i.e. for the device in the latter case, the whole source and drain contact trenches are masked). As will also be appreciated by one of skill in the art, the number of patterning steps may be more than one (e.g. if different color cuts are used for the specific pattern), so different combinations of process steps may be combined to achieve the desired pattern transferred into the structure.

Figure 15:
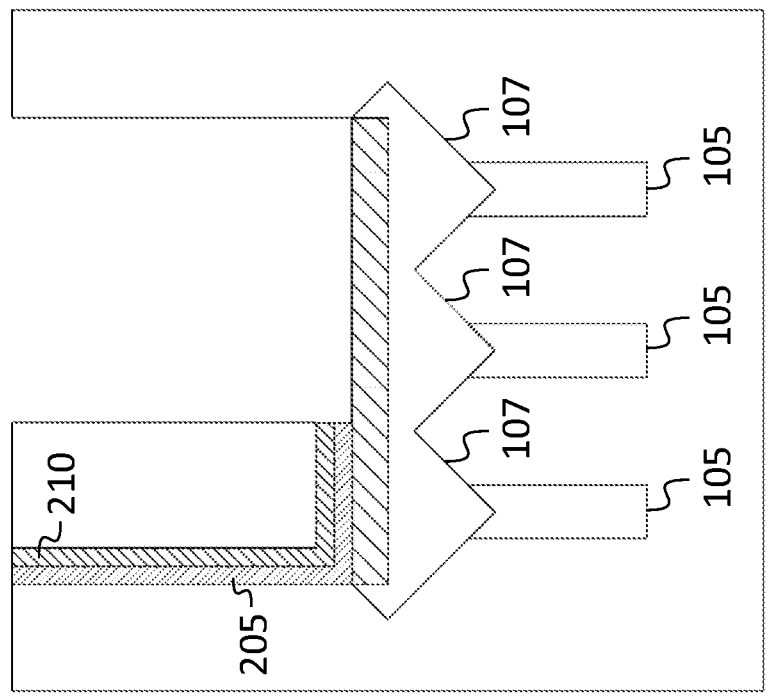
FIG. 15 is an intermediate structure formed during a process for forming a source-drain contact structure, according to an embodiment of the present invention.

Referring to FIG. 15, in a subsequent step (step 5), in embodiments that used a conformal deposition technique in step 2 to form the conductive ESL 210, the conductive ESL 210 may be removed from the sides of the trenches. This can be accomplished for example using a wet etch. For the embodiments using Co as the material of the conductive ESL 210, a wet etch can be used which etches Co selectively to silicides. In some embodiments, TiN layers, particularly if remaining at the sidewalls of the bottom region of the SD contact trench opening, may be removed as well in a wet etch. The purpose of step 5 is to eliminate conductive layers from the sidewalls of the bottom regions of the SD contact trench openings. This can be achieved by wet or dry etches in several embodiments. In some embodiments, if there are no conductive layers on the sidewalls of the bottom region of the SD contact trench opening at the end of step 4, then step 5 may be skipped.

In some embodiments, the elimination of conductive layers from the sidewalls of the bottom regions of the SD contact trench opening may be achieved by oxidation of said conductive layers present at the sidewalls of the bottom region of the SD contact trench opening; although this process does not physically eliminate said layers, it may transform their material properties and make them non-conductive; in such embodiments, care may be taken to not degrade the conductivity of the bottom conductive layer at the bottom of the SD contact trench opening (in some embodiments, a TiN layer may be protecting an underlying silicide from oxidation). An example of such embodiments is for cases in which the conductive layer on the sidewalls of the bottom regions of the SD contact trench opening includes, as a major component, Co.

Figure 16:
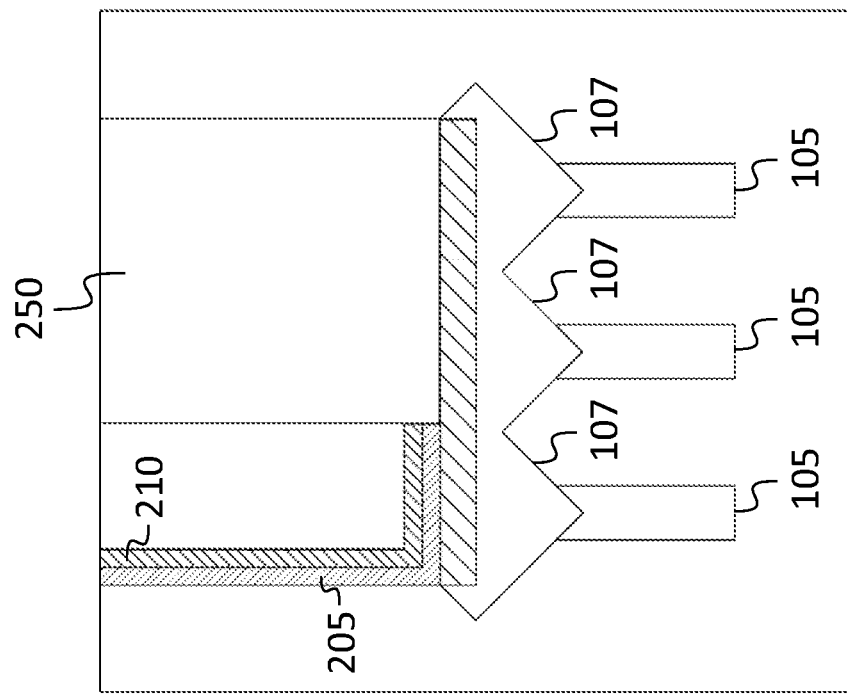
FIG. 16 is an intermediate structure formed during a process for forming a source-drain contact structure, according to an embodiment of the present invention.

Referring to FIG. 16, in a subsequent step (step 6), Region B is filled with a dielectric 250 such as SiO2, followed by appropriate planarization steps.

Figure 17:
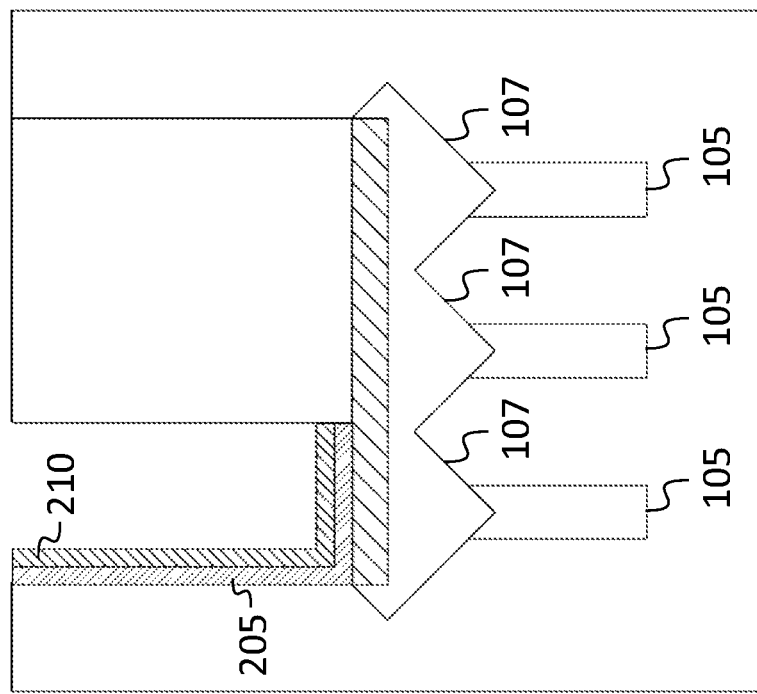
FIG. 17 is an intermediate structure formed during a process for forming a source-drain contact structure, according to an embodiment of the present invention.

Referring to FIG. 17, in a subsequent optional step (step 7), W from Region A is, in some embodiments, etched back, with the etch stopping on the conductive ESL 210.

Figure 18:
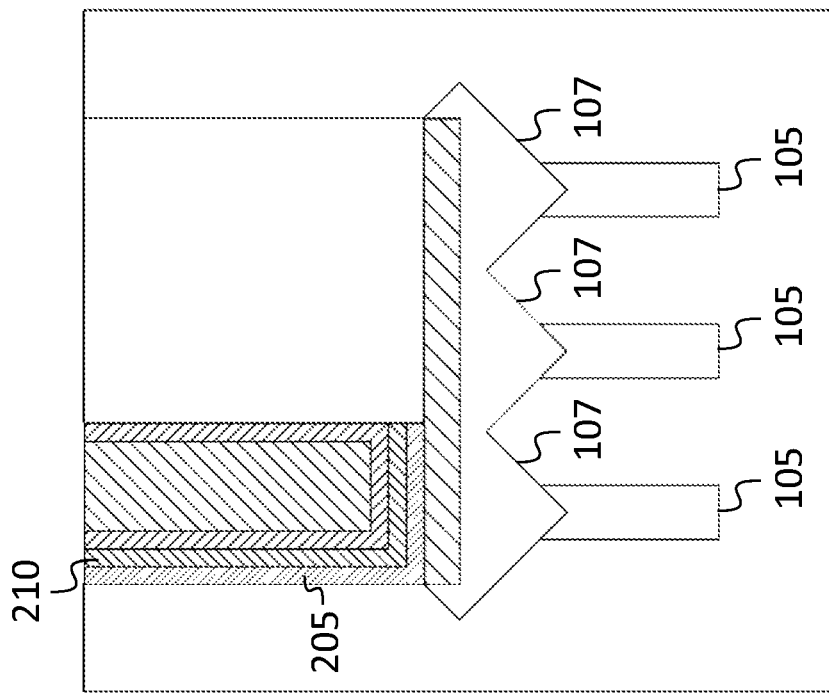
FIG. 18 is an intermediate structure formed during a process for forming a source-drain contact structure, according to an embodiment of the present invention.

Referring to FIG. 18, in a subsequent step (step 8) that may be performed if step 7 is performed, a new contact is formed, in some embodiments, using a fill material other than W, such as Co. Appropriate cleaning, surface preparation, liner formations, thermal steps, etc., are performed to ensure low resistivity contacts. Planarization steps may be performed after the formation of the new contact. The rest of the fabrication flow follows according to related art methods.

Figure 19A:
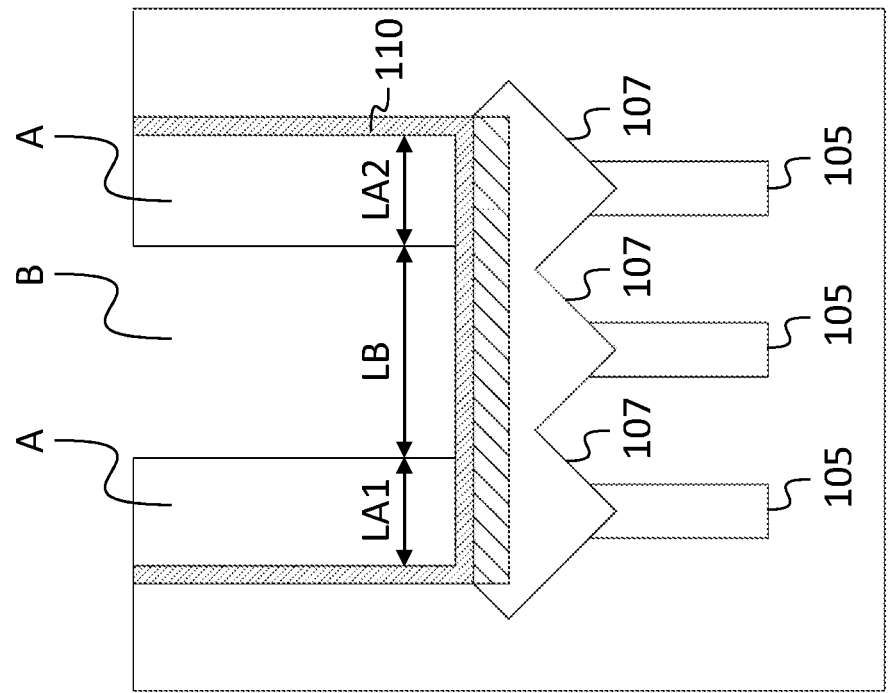
FIG. 19A is an intermediate structure formed during a process for forming a source-drain contact structure, according to an embodiment of the present invention.
Figure 19B:
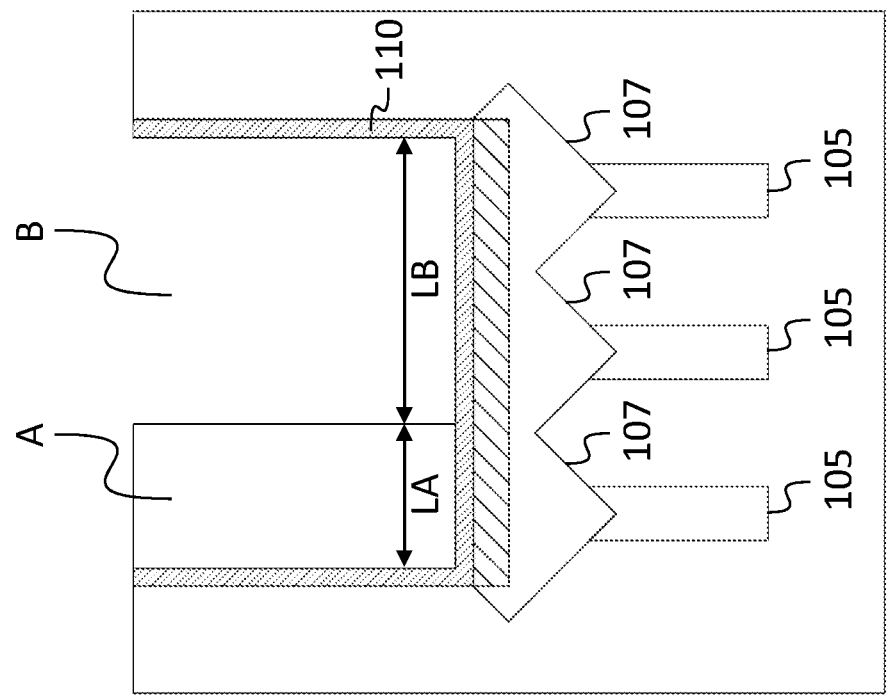
FIG. 19B is an intermediate structure formed during a process for forming a source-drain contact structure, according to an embodiment of the present invention.
Figure 19C:
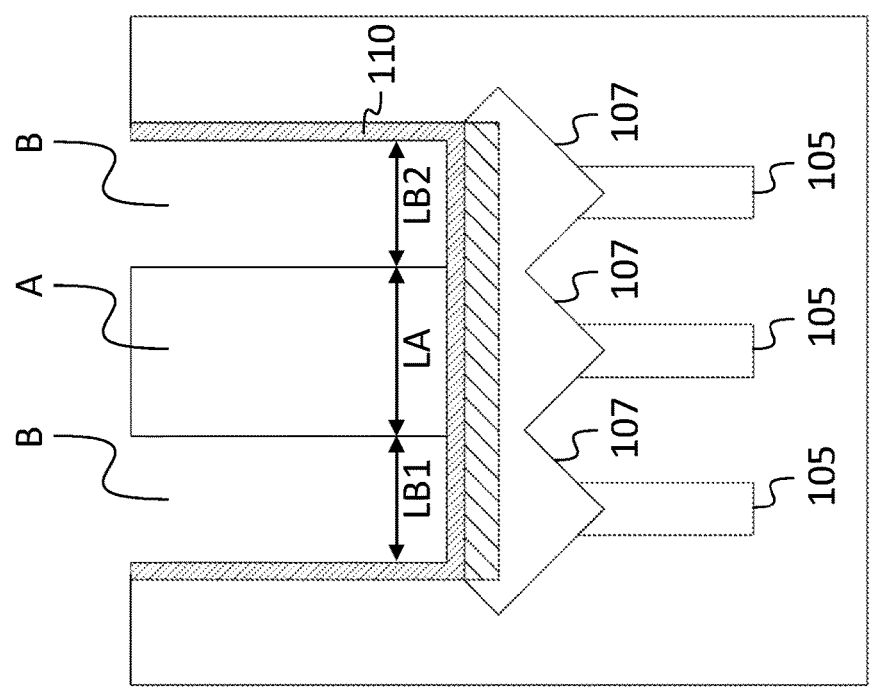
FIG. 19C is an intermediate structure formed during a process for forming a source-drain contact structure, according to an embodiment of the present invention.

FIGS. 19A-19C show alternate arrangements of Region A and Region B. FIG. 19A shows the structure of FIG. 5 after the mask has been removed, and before fill of step 6 (that results in the structure of FIG. 6) has been completed. As such, FIG. 19A shows the arrangement of Region A and Region B that results in the structures of, for example, FIG. 10 and FIG. 18. FIG. 19B shows an alternative that may result in the formation of two short trenches and of two corresponding vertical contact structures, one at each end of the long contact trench. The dimensions of the first Region A (LA1) and of the second Region A (LA2) (in a horizontal direction in the plane of the drawing, indicated in FIG. 19B as LA1 and LA2) may be the same, or LA1 may be greater or less than LA2. FIG. 19C shows an alternative intermediate structure that may result in the formation of a short trench and a corresponding vertical contact structure, at or near the middle of the long contact trench. The dimensions of the first Region B (LB1) and of the second Region B (LB2) (in a horizontal direction in the plane of the drawing, indicated in FIG. 19C as LB1 and LB2) may be the same, or LB1 may be greater or less than LB2. The illustrations of FIGS. 19B-19C show structures that may result if the mask 130 of FIG. 5 is modified to change the size, number or position of the regions (Region A in FIG. 5) that correspond to the contact structure to be formed. It will be understood that the mask 230 of FIG. 14 may be similarly modified to result in analogous changes in the contact structure shown in, e.g., FIG. 18.

As used herein, an anisotropic etch-back step may involve the use of a two step etch-back process sequence, using an anisotropic etch-back step first, followed by an isotropic etch-back second. In this case, the last isotropic etch may be designed to etch only a small portion of the first fill material, in some embodiments of less than about 15 nm, e.g., of less than about 10 nm. This is useful when the selectivity of the isotropic etch (i.e., the ability of etching the first fill material without etching the etch-stop layer) is significantly higher than that of the anisotropic etch.

In some embodiments an etch stop layer is used to allow control of the etch-back of the first fill material. If an etch stop layer is not used, then a timed etch-back may be used. In this case, as used herein the etch "substantially removing said first fill material" means that the fill material is completely removed, or that the top surface of the remaining fill material is at most 10 nm above the top the level of the top of the fin channels, and, e.g., at most 5 nm above the level of the top of the fin channels.

When indicating that the source-drain contact trench structure substantially overlaps the source-drain regions of all fins in a device, the present disclosure means that from a top view, the source-drain contact trench structure (the structure long direction is normal to the direction of transport in the fin channels) crosses across all central fins in a device (fins other than the outer fins of the device) and reaches the source-drain regions of the outer fins of the device). In some embodiments, it also overlaps about half of the source-drain regions of the outer fins of the device. In some embodiments, it also fully overlaps the source-drain regions of the outer fins of the device.

As used herein, the etch "substantially stopping" at the etch-stop layer refers to the selectivity being high enough to prevent punch through of the etch-stop layer during the etch. In some embodiments, the selectivity is not high enough to prevent punch through, but significantly improves the etch control as compared to cases without an etch-stop layer.

As used herein, a "wet etch that does not attack substantially the bottom conductive layer", means an etch as a result of which the sheet resistance of the bottom conductive layer is not increased in the regions exposed to the etch by more than a factor of 2 with respect of its sheet resistance before the wet etch.

The first fill material may be chosen from materials that can be etched anisotropically, e.g. by RIE (reactive ion etching), with high selectivity to the material of the gate spacers (which may be a nitride (e.g., SiN)). Examples of such fill materials are W and Si. High etch selectivity may refer to a selectivity of at least about 6:1 (i.e. etch rate of the first fill at least 6 time higher than etch rate of SiN), or, in some embodiments, to a selectivity of about 4:1 selectivity or higher. In some embodiments the selectivity may be as high as 20:1 or higher.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," "used" and "step" may be considered synonymous with the terms "utilize," "utilizing," "utilized," and "act" respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a method for forming low parasitic capacitance source and drain contacts have been specifically described and illustrated herein, many modifications and variations will be apparent to those skilled in the art. Accordingly, it is to be understood that a method for forming low parasitic capacitance source and drain contacts constructed according to principles of this invention may be embodied other than as specifically described herein. The invention is also defined in the following claims, and equivalents thereof.

What is claimed is:

1. A method for fabricating a source-drain contact for a fin field effect transistor (FinFET) device having a plurality of fins, and a source-drain structure, the method comprising:
    etching a first trench to the source-drain structure, the first trench having a first length in a first direction,
    forming a first conductive layer in the first trench, on the source-drain structure;
    forming an etch-stop layer in the first trench, on the first conductive layer;
    filling the first trench with a first fill material;
    forming a mask over a first portion of the first fill material, the mask not extending over a second portion of the first fill material;
    etching, with an anisotropic etch, the second portion of the first fill material to form a second trench having a second length, less than the first length, in the first direction; and
    filling the second trench with a second fill material, the second fill material being a dielectric.

2. The method of claim 1, wherein the source-drain structure comprises a plurality of source-drain regions, each of the source-drain regions corresponding to one of the plurality of fins, wherein the first conductive layer overlaps a portion of each of the source-drain regions.

3. The method of claim 1, wherein the first fill material comprises, as a major component, a semiconductor.

4. The method of claim 3, wherein the first fill material comprises, as a major component, a semiconductor selected from the group consisting of: silicon, silicon-germanium, germanium, and combinations thereof.

5. The method of claim 1, wherein the etch-stop layer comprises, as a major component, an oxide.

6. The method of claim 5, wherein the etch-stop layer comprises, as a major component, an oxide selected from the group consisting of: silicon dioxide, aluminum oxide, and combinations thereof.

7. The method of claim 1, wherein the first fill material comprises, as a major component, tungsten.

8. The method of claim 7, wherein the etch-stop layer comprises, as a major component, a conductor.

9. The method of claim 1, further comprising, after the filling a remainder of the first trench with the first fill material, planarizing a top surface of the first fill material.

10. The method of claim 1, further comprising, after the etching, with the anisotropic etch, of the second portion of the first fill material, removing the mask.

11. The method of claim 1, wherein the etching, with the anisotropic etch, of the second portion of the first fill material to form the second trench, comprises removing at least 90% of the first fill material in the second portion.

12. The method of claim 1, further comprising, after the filling of the second trench with the second fill material, planarizing a top surface of the second fill material.

13. The method of claim 1, further comprising, after the filling of the second trench with the second fill material, etching the first portion of the first fill material to form a third trench having a third length, less than the first length, in the first direction.

14. The method of claim 13, further comprising, after the forming of the third trench, filling the third trench with a third fill material, the third fill material being a conductor.

15. The method of claim 14, further comprising, after the forming of the third trench, and before the filling of the third trench with the third fill material, removing the etch-stop layer from a bottom of the third trench.

16. The method of claim 14, wherein the third fill material comprises, as a major component, a conductor selected from the group consisting of: tungsten, cobalt, and combinations thereof.

17. The method of claim 14, further comprising, after the forming of the third trench, and before the filling of the third trench with the third fill material, forming a conductive liner in the third trench.

18. The method of claim 17, wherein:
the conductive liner comprises, as a major component, a material selected from the group consisting of: titanium, titanium nitride, and combinations thereof; and
the third fill material comprises, as a major component, a material selected from the group consisting of: tungsten, cobalt, and combinations thereof.

19. A method for fabricating a source-drain contact for a fin field effect transistor (FinFET) device having a plurality of fins, and a source-drain structure, the method comprising:
etching a first trench to the source-drain structure, the first trench having a first length in a first direction,
forming a first conductive layer in the first trench, on the source-drain structure;
forming an etch-stop layer in the first trench, on the first conductive layer;
filling the first trench with a first fill material;
forming a mask over a first portion of the first fill material, the mask not extending over a second portion of the first fill material;
etching, with an anisotropic etch, the second portion of the first fill material to form a second trench having a second length, less than the first length, in the first direction; and
filling the second trench with a second fill material, the second fill material being a dielectric,
wherein the first fill material comprises, as a major component, a material selected from the group consisting of: silicon, silicon-germanium, germanium, and combinations thereof, and
wherein the etch-stop layer comprises, as a major component, a material selected from the group consisting of: silicon dioxide, aluminum oxide, and combinations thereof.

20. A method for fabricating a source-drain contact for a fin field effect transistor (FinFET) device having a plurality of fins, and a source-drain structure, the method comprising:
etching a first trench to the source-drain structure, the first trench having a first length in a first direction,
forming a first conductive layer in the first trench, on the source-drain structure, the first conductive layer comprising:
as a major component, a material selected from the group consisting of titanium silicide, nickel silicide, cobalt silicide, and combinations thereof, or
a bi-layer comprising:
a lower sub-layer comprising, as a major component, a silicide; and
an upper layer, comprising, as a major component, a conductive nitride;
forming a conductive etch-stop layer in the first trench, on the first conductive layer, the forming of the etch-stop layer comprising a chemical vapor deposition process and/or a physical vapor deposition process, the etch-stop layer comprising, as a major component, cobalt;
forming a first liner in the first trench, the forming of the first liner comprising a chemical vapor deposition process and/or a physical vapor deposition process;
filling the first trench with a first fill material comprising, as a major component, tungsten;
forming a mask over a first portion of the first fill material, the mask not extending over a second portion of the first fill material;
etching, with an anisotropic etch, the second portion of the first fill material to form a second trench having a second length, less than the first length, in the first direction;
filling the second trench with a second fill material, the second fill material being a dielectric;
etching the first portion of the first fill material to form a third trench having a third length, less than the first length, in the first direction;
forming a second liner in the third trench, the forming of the second liner comprising a chemical vapor deposition process and/or a physical vapor deposition process, the second liner comprising, as a major component, a material selected from the group consisting of: titanium, titanium nitride, and combinations thereof; and
filling the third trench with a third fill material, the third fill material comprising, as a major component, a material selected from the group consisting of tungsten, cobalt, and combinations thereof.

* * * * *